(12) United States Patent
Kimura et al.

(10) Patent No.: US 8,731,706 B2
(45) Date of Patent: May 20, 2014

(54) VACUUM PROCESSING APPARATUS

(75) Inventors: Shingo Kimura, Shunan (JP); Shouji Okiguchi, Kudamatsu (JP); Akira Kagoshima, Kudamatsu (JP); Shinji Obama, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 421 days.

(21) Appl. No.: 12/388,617

(22) Filed: Feb. 19, 2009

(65) Prior Publication Data

US 2010/0068009 A1    Mar. 18, 2010

(30) Foreign Application Priority Data

Sep. 12, 2008  (JP) ................................. 2008-234163

(51) Int. Cl.
*H01L 21/67*      (2006.01)

(52) U.S. Cl.
USPC ........... 700/214; 700/112; 700/100; 700/115; 700/121; 700/213; 414/225.01; 414/806

(58) Field of Classification Search
USPC .................. 700/213, 214, 228; 414/161, 273
See application file for complete search history.

(56) References Cited

U.S. PATENT DOCUMENTS

| 6,243,612 B1 * | 6/2001 | Rippenhagen et al. ........ 700/100 |
| 7,949,425 B2 * | 5/2011 | Mitchell et al. ................ 700/228 |
| 2002/0076306 A1 * | 6/2002 | Tateyama et al. ......... 414/225.01 |
| 2006/0155412 A1 * | 7/2006 | Ikeda ............................ 700/112 |
| 2011/0313562 A1 * | 12/2011 | Zhen et al. ..................... 700/213 |

FOREIGN PATENT DOCUMENTS

| JP | 2006-190894 | 7/2006 |
| JP | 2007-12917 | 5/2007 |

* cited by examiner

*Primary Examiner* — Ramya Burgess
*Assistant Examiner* — Kyle Logan
(74) *Attorney, Agent, or Firm* — Antonelli, Terry, Stout & Kraus, LLP.

(57) ABSTRACT

A vacuum processing apparatus includes a plurality of vacuum containers; a vacuumized transfer unit connected with the vacuum containers and having a transfer chamber; a plurality of lock chambers connected to the vacuumized transfer unit; a vacuumized transferring section arranged in the transfer chamber to transfer the sample between each of the lock chambers and each of the processing chambers inside the plurality of vacuum containers; an atmospheric transfer container having a space through which the sample is transferred under the atmospheric pressure; an atmospheric transfer unit arranged in the atmospheric transfer container and adapted to transfer the sample from a cassette; and a controller operative on the basis of schedule information of a plurality of operations to adjust the operations, the information including times of stagnation of the plurality of samples and set therefor.

8 Claims, 8 Drawing Sheets

VACUUM PROCESSING APPARATUS

BACKGROUND OF THE INVENTION

The present invention relates to a vacuum processing apparatus for processing an objective, for example, a substrate-like sample such as a semiconductor wafer in a processing chamber inside a vacuum container and more particularly, to a vacuum processing apparatus having a plurality of vacuum containers (process units) provided for a transfer system unit, generally called a cluster tool, thus having the ability to process a plurality of wafers to improve the productivity.

A semiconductor production apparatus for producing a semiconductor device by processing a semiconductor wafer as above is provided with a plurality of process units each having a vacuum container with an internal processing chamber called a process unit, a vacuum evacuation unit and a plasma generation unit and is used to process a substrate-like sample such as a semiconductor wafer (hereinafter referred to as a wafer) by using a plasma generated in the processing chamber. In the semiconductor production apparatus of this type, low costs and improved productivity are demanded and especially, an important problem resides in that the number of wafers to be processed per unit time is increased to promote the efficiency of process which one apparatus can yield.

In the aforementioned semiconductor production apparatus, a cassette for storing a predetermined number of wafers, for example, 25 wafers is mounted in front of the apparatus and a robot for transfer takes out wafers one by one from the cassette and transfers it to a lock chamber and thereafter the thus extracted wafer to be applied with processing is transferred from the lock chamber, vacuum evacuated for pressure reduction, to a processing chamber inside a vacuum container of each of the process units for processing through the medium of a reduced-pressure transfer path, causing the wafer to be processed in the processing chamber. After the process ends subsequently, the wafer is again taken out so that it may be returned to the atmospheric pressure by way of the lock chamber through the medium of a path in a direction opposite to the take-in direction. Thereafter, the wafer is returned to the identical position from which it is taken out by means of the transfer robot. This is the general operation sequence of processing the wafer in the semiconductor production apparatus.

For the operation sequence, operation patterns are available including assigning a plurality of process units to one cassette, assigning one process unit to one cassette and assigning a plurality of process units to a plurality of cassettes at a time and as the case may be, a process is carried out over a plurality of process units or a process is carried out for adjusting the condition of the process unit in advance, demonstrating that there are a variety of sophisticated operation patterns.

Examples of the semiconductor production apparatus technique are known from JP-A-2006-190894 and JP-A-2007-129177.

JP-A-2006-190894 discloses a cluster tool having a plurality of processing chambers (process modules) and a transfer mechanism for interconnecting them and when the transfer mechanism delivers samples to the individual processing chambers in accordance with processes to be applied sequentially to the samples inside the plural processing chambers, an unprocessed sample is interchanged with a processed sample to thereby improve the total transfer efficiency.

JP-A-2007-129177 discloses a cluster tool having a plurality of processing chambers (process modules) and a transfer mechanism for interconnecting them and the sample transfer is not started until conditioning of all of the plural processing chambers has been completed but is started in sequence initially with a processing chamber whose conditioning has been completed, thus improving the total transfer efficiency.

SUMMARY OF THE INVENTION

The above related arts fail to consider the following points sufficiently, raising problems.

More specifically, in a vacuum processing apparatus used in the related arts, the plural processing chambers have their side walls connected to the side wall of the periphery of a vacuumized transfer container the interior of which is a space for vacuumized transfer. Therefore, a transfer system unit or transfer unit for vacuumized transfer inside the vacuumized transfer container is used in common to the process units for individual processes or shared so to speak. In such an apparatus, the time for the next operation is largely affected by the end time of a process in the processing chamber of each process unit.

Accordingly, if the sequence of operations in the transfer unit is determined such that wafers now being ready for transfer are sequentially transferred, in the case of simultaneous establishment of preparation for transfer in a plurality of processing chambers or parallel establishment of preparation for transfer in another processing chamber on the way of transfer of another wafer, a plurality of transferable wafers are sequentially transferred by first finishing transfer in one processing chamber and thereafter shifting to transfer in the other processing chamber by pausing transfer on the way of operation and then shifting to the next transfer operation, with the result that a waiting time is caused to occur in at least one processing chamber, amounting up to a transfer time required for one wafer transfer at the most.

In order to reduce the waiting time, JP-A-2006-190894 discloses that module cycle time is defined and besides, the transfer robot for transferring a wafer picks and places a processed wafer and an unprocessed wafer through one access. The related art does not consider sufficiently adjustment of the timing of occurrence of waiting time, failing to take into account a problem that the waiting time occurs unexpectedly and is cumulated, thus reducing the number of wafers to be processed per unit time to a great extent.

Further, in the above related art, except for a time-fixed process, the process time in each processing chamber and time consumed for transfer are uncertain and therefore, shift to the next operation is not done until actual completion of process and transfer operation is confirmed or a completion signal is received. Accordingly, timings of the nest process and transfer are determined in accordance with a yield scheme based on the results of all processes and operations, thus preventing scheduling from being made in advance and even if a schedule can be made, the resulting scheduling is applicable at most to such an extent that which one of wafers is to be processed in which one of processing chambers.

As will be seen from the above, the related arts can hardly be said to have the ability to operate the apparatus efficiently, impairing the throughput of the apparatus.

An object of the present invention is to provide a vacuum processing apparatus capable of improving the throughput.

The above object can be accomplished by a vacuum processing apparatus comprising:

a plurality of vacuum containers each having a processing chamber in which a sample placed in a reduced pressure environment is processed by using a plasma formed in the processing chamber;

a vacuumized transfer unit having its periphery connected with the vacuum containers and having in its interior a transfer chamber which is reduced in pressure and through which the sample is transferred;

a plurality of lock chambers connected to the vacuumized transfer unit and each having its interior adjustable in pressure to the atmospheric pressure and a reduced pressure while the sample being placed in the interior, the sample being delivered/received between the vacuum side and the atmospheric side of the interior;

a vacuumized transferring section arranged in the transfer chamber to transfer the sample between each of the lock chambers and each of the processing chambers inside the plurality of vacuum containers;

an atmospheric transfer container connected to the atmospheric side of the lock chamber and including, in its interior, a space through which the sample is transferred at the atmospheric pressure;

an atmospheric transfer unit arranged in the space of the atmospheric transfer container and adapted to transfer the sample from a cassette having its frontal side on which the sample is stored; and a controller operative on the basis of schedule information of a plurality of operations to adjust the plural operations, the information including times of stagnation of the plurality of samples and set therefor, the plurality of operations covering take-out of the sample from the cassette, processing the sample in the processing chamber and thereafter returning the sample to the cassette.

Further, the operation schedule information is determined in accordance with the case in which one of the plurality of lock chambers is fixedly used for loading and the other is fixedly used for unloading.

Furthermore, pursuant to the schedule information, the time of stagnation of the sample is arranged immediately before the operation for taking in the sample to the lock chamber and immediately after completion of processing the sample in the processing chamber.

Furthermore, the controller has the function to cumulate and calculate times of individual operations of taking out the sample from the cassette, processing it in the processing chamber and thereafter returning it to the cassette and the function to detect one of the plurality of operations covering take-out of the sample from the cassette, process of the sample in the processing chamber and subsequent return of the sample to the cassette, the one operation impersonating a rate-controlling operation.

Furthermore, the controller uses precedently stored information concerning times of individual operations covering take-out of the sample from the cassette, process of the sample in the processing chamber and thereafter return of the sample to the cassette so as to carry out the cummulation for a plurality of kinds of schedules in which the order of these operations and the stagnation time are made to be different and from the plurality of kinds of schedules, selects as operation schedule information an operation which minimizes the total process time for processing a given number of the samples.

Other objects, features and advantages of the invention will become apparent from the following description of the embodiments of the invention taken in conjunction with the accompanying drawings.

DETAILED DESCRIPTION OF THE EMBODIMENTS

Embodiments of the present invention will now be described with reference to the accompanying drawings.

The present invention intends to improve the throughput in the transfer rate-controlling region and in the case of the process time in a processing chamber (process unit) being sufficiently short, by scheduling in advance all steps associated with processing a sheet of wafer, the stable throughput can be realized which does not depend on timings of individual processes/individual operations. In a multi-chamber system generally called a cluster tool in which a plurality of processing chambers (process units) are provided for a single transfer system, there is a region in which the throughput is determined by operation of the transfer system (time required for transfer) if the process time in the pressing chamber is sufficiently short. This is due to such a phenomenon that because of the short processing time, the throughput of the plural processing chambers per unit time overruns the transfer time consumed for a sheet of wafer. This phenomenon is considered as impersonating the transfer rate-controlling region. But by using teachings of the present invention, the throughput in the transfer rate-controlling region can be improved and an apparatus expecting the stable throughput can be obtained. An embodiment of the invention will now be described with reference to FIGS. 1 to 5.

Figure 1:
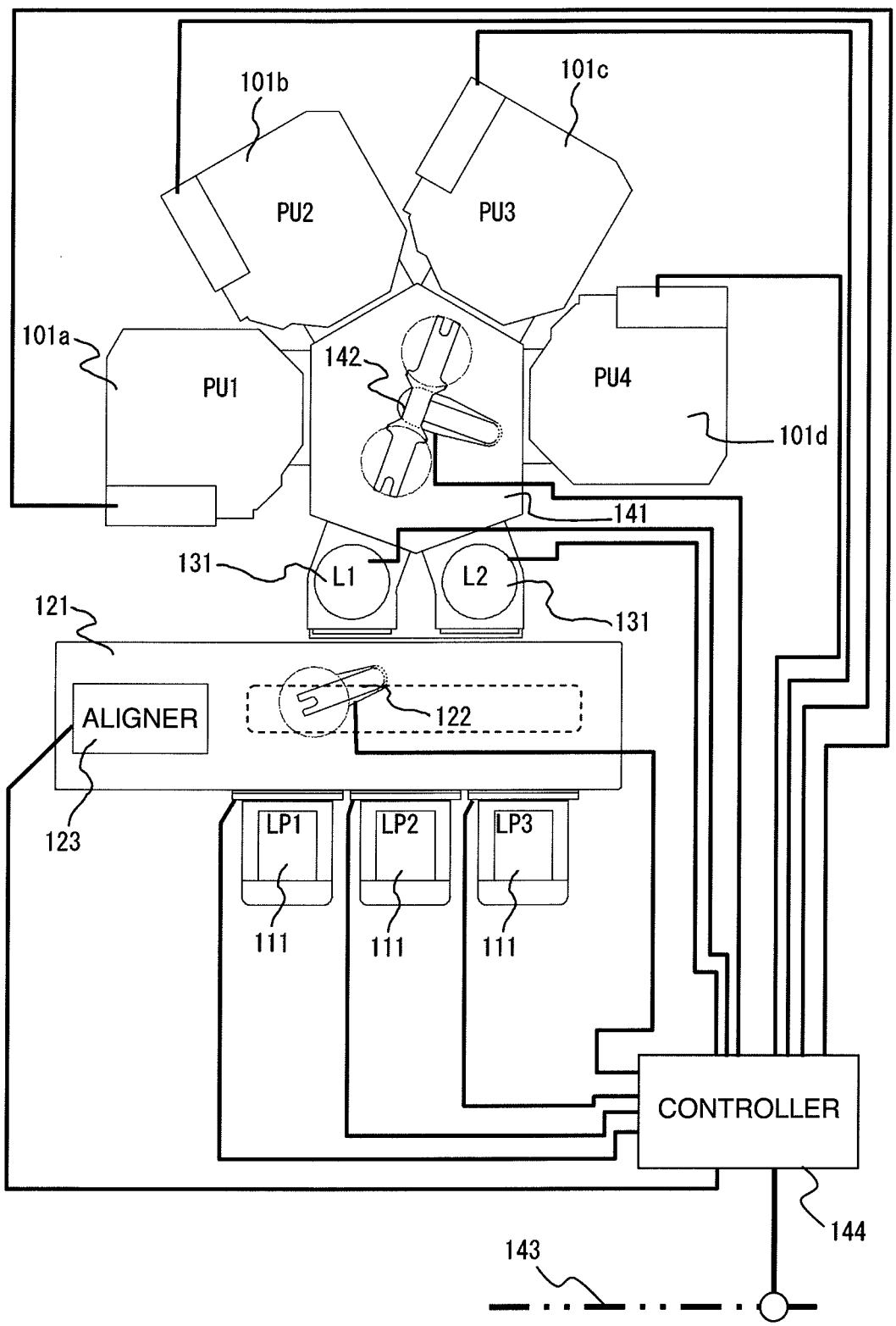
FIG. 1 is a top view schematically showing the construction of a vacuum processing apparatus according to an embodiment of the invention.

The construction of a vacuum processing apparatus according to the present embodiment of the invention is illustrated in top view form in FIG. 1. In the present embodiment, the vacuum processing apparatus is a multi-chamber system comprising a single transfer system unit 142 generally called a cluster tool and located centrally, a plurality of vacuum containers arranged outer-peripherally of the transfer unit and having internal processing chambers connected to the transfer system unit, a plurality of vacuum evacuation units and a plurality of units for processing (process units) each provided with a plasma generation unit.

Further, the vacuum processing apparatus of the present embodiment has a transfer path formed in the front side (lower side in the drawing) and in which a cassette storing a predetermined number of wafers is transferred and comprises a vacuumized transfer unit 141 facing the transfer path and adapted to transfer wafers under vacuum environment and an EFEM 121 constituting an atmospheric side block having a plurality of load ports 111 provided in front of 4 process units 101*a* to 101*d* connected to the side of the unit 141. Further, the transfer system unit includes lock chambers 131 connected to the back of the EFEM 121 and each used for taking-in and taking-out a wafer between vacuum side and atmospheric pressure side.

In the present embodiment, three load ports 111 are arranged in the front of the EFEM 121 and a cassette storing wafers is located in each load port 111 having at the front a stage operative frontward and backward, a chucking mechanism for opening/closing a lid of the cassette and an up/down mechanism for storing the lid downwards. The ascending/descending mechanism for the lid also has the sensing function of checking/counting the presence or absence of wafer/the number of wafers stored in the cassette.

The EFEM 121 includes, in its interior, a substantially square-pillar shaped container for atmospheric transfer provided with a transfer chamber forming a space through which the wafer is transferred between the cassette and the load port 111. Also included in the EFEM are a fan for forming a downward air stream in the container with the aim of reducing foreign matters in the atmospheric transfer chamber and a filter for capturing foreign matters, so that the transfer chamber can provide a space in which less foreign matters prevail and the pressure is slightly higher than that in the surrounding environment. An atmospheric transfer robot 122 for transferring the wafer is arranged in the transfer chamber for atmospheric transfer and an aligner 123 is arranged in the container. The aligner 123 is a mechanism adapted to perform positional alignment of a wafer stored in the cassette and also perform fitting of an angle of a cut formed in the outer periphery of the wafer, called a notch, thereby ensuring that indexing of the wafer center can be attained to materialize less positional misalignment and highly accurate wafer transfer.

Wafer take-out from the interior of the cassette on the load port 111 and wafer take-out from the aligner 123 are carried out by means of the atmospheric transfer robot 122 and the wafer aligned in position which is taken out of the aligner 123 is taken into the interior of the lock chamber 131. The atmospheric transfer robot 122 can move not only in the right and left direction on a rail extending along the front side in the space of the EFEM 121 but also upwards/downwards and right/left by a distance by which the wafer can be delivered to the aligner 123 located at the left end in the drawing of the EFEM 121 or to the cassette or the lock chamber 131.

The plurality of lock chambers 131 are arranged between the back of the EFEM 121 and the frontal side (forward and downward in the drawing) of the vacuum container constituting the vacuumized transfer unit 141. In the present embodiment, the pressure in each of the lock chambers 131 can be changed between the atmospheric pressure and the vacuum pressure and the lock chamber can be used for loading by being reduced in pressure from the atmospheric pressure to the vacuum or for unloading by being raised in pressure from the vacuum to the atmospheric pressure.

Each lock chamber 131 is provided with a gate valve mechanism having valves on the opposite sides for hermetically closing or opening the interior of the lock chamber and a drive unit for driving the valves, an evacuation unit for vacuum evacuation and a ventilation unit for returning the internal pressure to the atmospheric pressure. When the lock chamber 131 loads the wafer to the vacuum side, the gate valve arranged at the side (atmospheric side) of the EFEM 121 is opened to permit the atmospheric transfer robot 122 to intrude into the interior and thereafter, the wafer whose positioning is finished by means of the aligner 123 is carried into the interior by means of the atmospheric transfer robot 122.

After the wafer has been delivered onto a sample stage arranged inside the lock chamber 131, the atmospheric transfer robot 122 retreats and the gate valve for the atmospheric side is closed hermetically. Then, vacuum evacuation is conducted by using the evacuation unit until the interior of the chamber reaches a pressure of target vacuum degree. When completion of vacuum evacuation is determined, the gate valve on the side of the vacuumized transfer unit 141 is opened and the vacuumized transfer robot 142 provided for the vacuumized transfer unit 141 can be ready for intrusion into the interior.

In this manner, the interior of lock chamber 131 is vacuum evacuated from the atmospheric pressure (pressure reduction) to make a preparation for transfer to the vacuumized transfer unit 141 under vacuum condition. The lock chamber 131 also has the ventilation function to take out the wafer in the vacuum environment from the vacuumized transfer unit 141 to the atmospheric pressure environment, performing either operation in accordance with the flow of the wafer.

The vacuumized transfer unit 141 includes a vacuum container internally having a transfer chamber in the form of a space for transferring the wafer under vacuum pressure, an evacuation unit for vacuum evacuating the transfer chamber and the vacuumized transfer robot 142 arranged in the interior of the transfer chamber substantially centrically thereof to perform wafer transfer in the vacuum environment. In the present embodiment, the vacuum container of vacuumized transfer unit 141 is shaped into a substantially polygonal form as viewed from above (especially a hexagonal form in the present embodiment), having its periphery surrounded by process unit a to process unit d and two lock chambers 131 which are detachably mounted to the vacuumized transfer unit 141. More specifically, side surfaces forming individual sides are detachably connected with the process units 101*a* to 101*d* and two lock chambers 131 and under this connection status, the interior of the transfer chamber is made to be in communication with the interior of the respective process chambers of process units 101*a* to 101*d* and the interior of the respective two lock chambers 131 by way of the gates so shaped as to permit the individual wafer to pass therethrough.

The vacuumized transfer robot 142 intrudes to the lock chamber 131 having its gate valve opened and delivers/receives the wafer to/from the sample stage inside the lock chamber 131. After having received the wafer, the vacuumized transfer robot 142 shrinks while holding the wafer inside the transfer chamber, then swivels towards the processing chamber of a target one of the process units 101*a* to 101*d*, stops swiveling at a position confronting the gate for making communication of the processing chamber with the transfer chamber and eventually extends to carry the wafer into the processing chamber.

In the present embodiment, the wafers are transferred in order of the processing chambers which have been ready for reception of wafer. Between the vacuumized transfer unit 141 and each of the process units 101*a* to 101*d*, the gate valve for hermetical open/close adapted to close/open the interior of the processing chamber is arranged, the gate valve being opened when the wafer is brought into or taken out from the processing chamber. In the processing chamber into which the wafer has been brought, the gate valve is closed and thereafter, the wafer is processed in accordance with a predetermined recipe and after completion of the process, taken out by means of the vacuumized transfer robot 142 in the inverse procedure to that during take-in.

After receiving the processed wafer, the vacuumized transfer robot 142 takes out the wafer from the processing chamber in the procedure inverse to that during take-in and transfers the wafer to the next target chamber. In this phase, if the next process is to be done with a different processing chamber 101, the robot swivels to the target processing chamber 101 but if the wafer is to be taken out, the robot swivels to a lock chamber 131 being ready therefor. In the vacuum processing apparatus of the present embodiment, for processing the wafer, one of the two lock chambers 131 may limitedly be used for loading and the other may limitedly be used for unloading or either of them may be used for the both operations, either mode being usable selectively. In the former limited use, the lock chamber 131 is used by the wafer in only one of load and unload directions and consequently, the unprocessed wafer can be prevented from being contaminated in the lock chamber 131 by the gas used for processing. In the latter limited use, the throughput in the lock chamber 131 can be improved.

After the processed wafer has been transferred and mounted on the internal sample stage by means of the vacuumized transfer robot 142 and the gate valve on the side of vacuumized transfer unit 141 of the lock chamber 131 has been closed, ventilation is carried out in order to return the chamber interior from the vacuum environment to the atmospheric pressure. For ventilation, an N2 (dried nitrogen) is used and is introduced into the chamber at a predetermined rate to gradually set up the atmospheric pressure. In the lock chamber 131 having its interior reaching the atmospheric pressure, the gate valve on the atmospheric side (on the EFEM 121 side) is opened and the wafer is transferred to the internally intruding atmospheric transfer robot 122 and taken out thereby, followed by closure of the gate valve on the atmospheric side.

Thereafter, operation of reducing the pressure again for unloading the next wafer and operation of restoring the wafer in the cassette may be conducted in parallel. The atmospheric transfer robot 122 having received the processed wafer moves to the cassette in which that wafer has been stored before processing and returns the wafer to the position at which it has been stored before processing, eventually ending a series of processes applied to one sheet of wafer.

In carrying out a series of processes as above, not all operations and processes are activated associatively or synchronously and so, a rate-controlling point which disturbs the productivity, that is, determines the efficiency of production or throughput of the whole of vacuum processing apparatus takes place necessarily in the course. When taking the apparatus construction shown in FIG. 1, for instance, and summing it up from such a viewpoint that the amount (faculty) per unit time consumed for a process of receiving a wafer from the preceding chamber, unit or apparatus and of transferring the wafer to the succeeding unit, the faculty can be considered as being divided into four faculties the EFEM 121, the lock chamber 131, the vacuumized transfer unit and the process units 101*a* to 101*d* have, respectively. A quarter having the lowest one of the four processing faculties determines the throughput of the whole vacuum processing apparatus, that is, the productivity. The vacuumized transfer unit 141, the lock chamber 131 or the like variably impersonates this quarter depending on an occasional running method of handling the wafer as to which route the wafer taken out of the cassette is transferred through, which process unit the wafer is processed in and thereafter which route the wafer is transferred to returns to the original cassette through.

In the present embodiment, the time each of the process units 101*a* to 101*d* consumes for processing the wafer is larger than any of the time required for the atmospheric transfer robot 122 to transfer the wafer from the cassette to any one of the lock chambers 131 through the aligner 123 (atmospheric transfer time), the time for the pressure in the lock chamber 131, in which the wafer is stored, to rise after hermetic close and then fall upon opening of the interior (time associated with the interior of lock chamber) and the time for the wafer to be transferred by means of the vacuumized transfer robot 142 between any one of the process units 101*a* to 101*d* and any one of the lock chambers 131 (vacuumized transfer time).

In other words, if an etching process is conducted in the interior of the respective process units 101*a* to 101*d*, the etching process faculty the respective process units have is less than the transfer faculty obtained by operations of the atmospheric transfer robot 122, lock chamber 131 and vacuumized transfer robot 142. Thus, it can be concluded that in the wafer process in the vacuum processing apparatus, the process in the process units impersonates a rate of controlling operation in relation to the efficiency of the whole vacuum processing apparatus, the throughput and the production efficiency.

But, with the semiconductor device highly integrated in recent years, the thickness of a film representing a process objective which is formed on the surface of a semiconductor wafer to be worked decreases and therefore, the time consumed for the process applied to the wafer in the process units 101*a* to 101*d* decreases.

Namely, the throughput of the vacuum processing apparatus can be improved by reducing the time of etching process but on the other hand, as the time required for processing reduces approaching the time required for transfer and the rate of controlling operation related to the efficiency of operation and throughput of the vacuum processing apparatus so changes as to be related not to the etching process but to the transfer.

In the vacuum processing apparatus as above, for the purpose of improving the throughput and production efficiency, the transfer operation impersonating a rate-controlling operation is required to be adjusted properly. In the present embodiment, by determining in advance start and stop of individual operations relating to the transfer the vacuum processing apparatus conducts (pre-scheduling), the productivity and efficiency can be improved.

Figure 2:
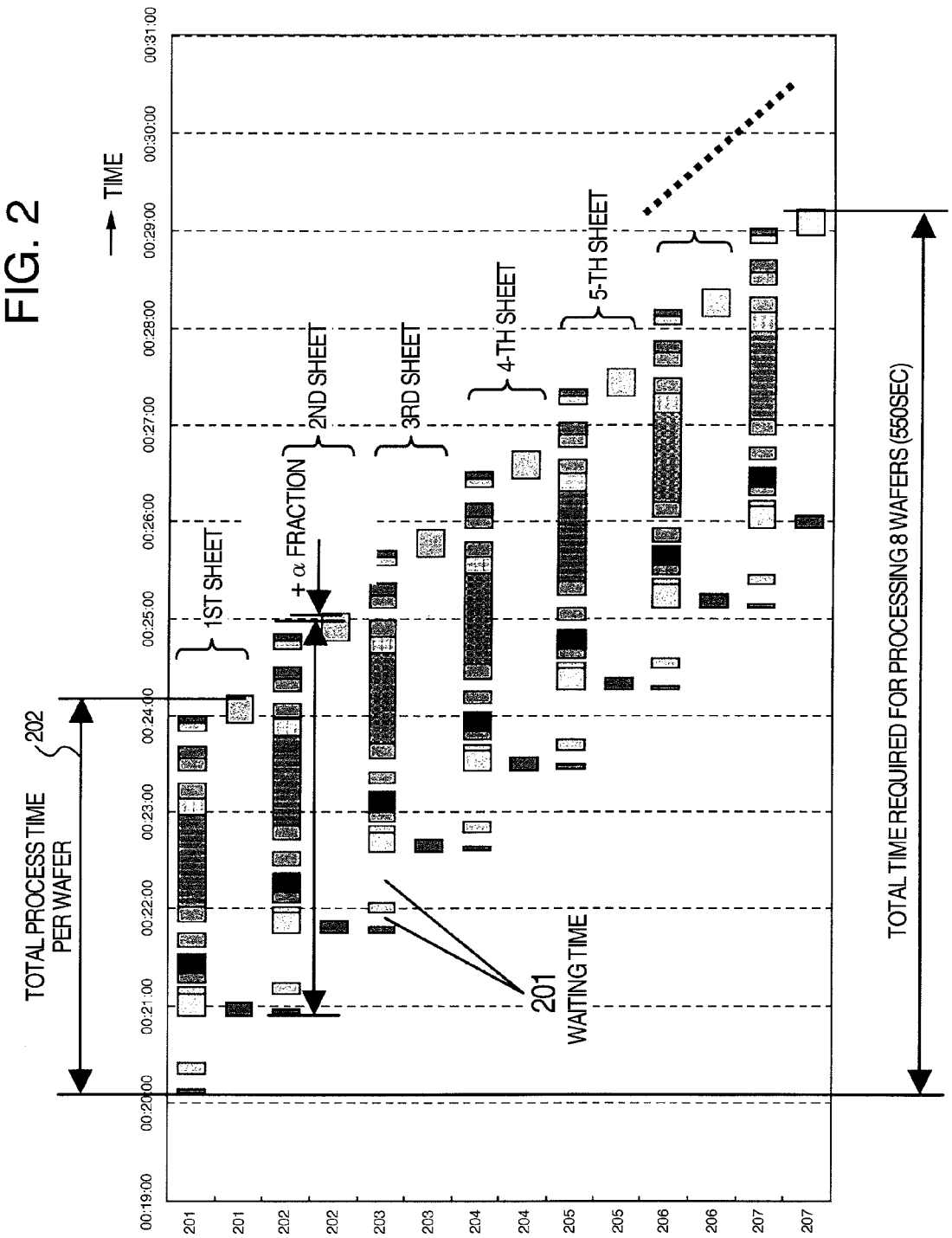
FIG. 2 is a chart showing flow of time-change dependent operations for individual wafers when a predetermined number of wafers are processed sequentially.

Turning to FIG. 2, there is illustrated a chart showing flow of operation for individual wafers as time elapses when a predetermined number of wafers, for example, 25 wafers are processed in sequence in the vacuum processing apparatus of the related art. Especially, in this example, the flow is given in the form of a gant-chart, in which individual operations are depicted in different colors, when a cassette storing 25 wafers is placed on the load port, running is executed to sequentially process the 25 wafers according to the same recipe by using process units 101*a* to 101*d* or PU1 to PU4 and operational conditions at quarters at which the transfer and operation of the vacuum processing apparatus and the wafers are stagnated for a given time in the course. As one wafer moves along the cassette the process chamber the cassette, the flow of operation which prevails in this course is indicated in two lines for convenience of illustration to clarify a parallel and overlapping operation by indicating in lower line.

As will be seen from FIG. 2, during the course ranging from the initial operation for process of each wafer where the wafer is taken out of the cassette by means of the atmospheric transfer robot 122 to the final process of the wafer where the wafer is returned to the original cassette position by means of the atmospheric transfer robot 122, there are several time intervals 201 (hereinafter referred to as waiting times) during which none of the above operations are executed.

Because of the waiting time 201, operation cannot immediately proceed to the next operation as soon as the present operation ends, causing the wafer to stagnate at the position and wait till the next operation. According to the study by the present inventors, non-establishment of the schedule of transfer is responsible for the occurrence of this waiting time. More specifically, the time of completion of positioning at each portion where the wafer is held (station), for example, at aligner 123, the time of completion of the operation of preparation for wafer transfer/reception at the lock chamber 131 (for example, ventilation) and the time of completion of the operation of preparation for taking out the wafer to the vacuumized transfer unit 141 at the lock chamber 131 (for example, vacuum evacuation) become each unbalanced with the operation of the atmospheric transfer robot 122 and vacuumized transfer robot 142, with the result that irrespective of the fact that the individual stations are ready for transfer of wafer, the atmospheric transfer robot 122 and vacuumized transfer robot 142 adapted to transfer the wafer between the respective stations are urged to operate other processes, failing to immediately cope with the situations.

Besides, the waiting time 201 develops non-periodically in an unplanned fashion and increases the total process time for one sheet of wafer bit by bit. Then, what the influence the bit-by-bit increase in the total process time 202 per one sheet of wafer has upon will be described below.

Figure 3:
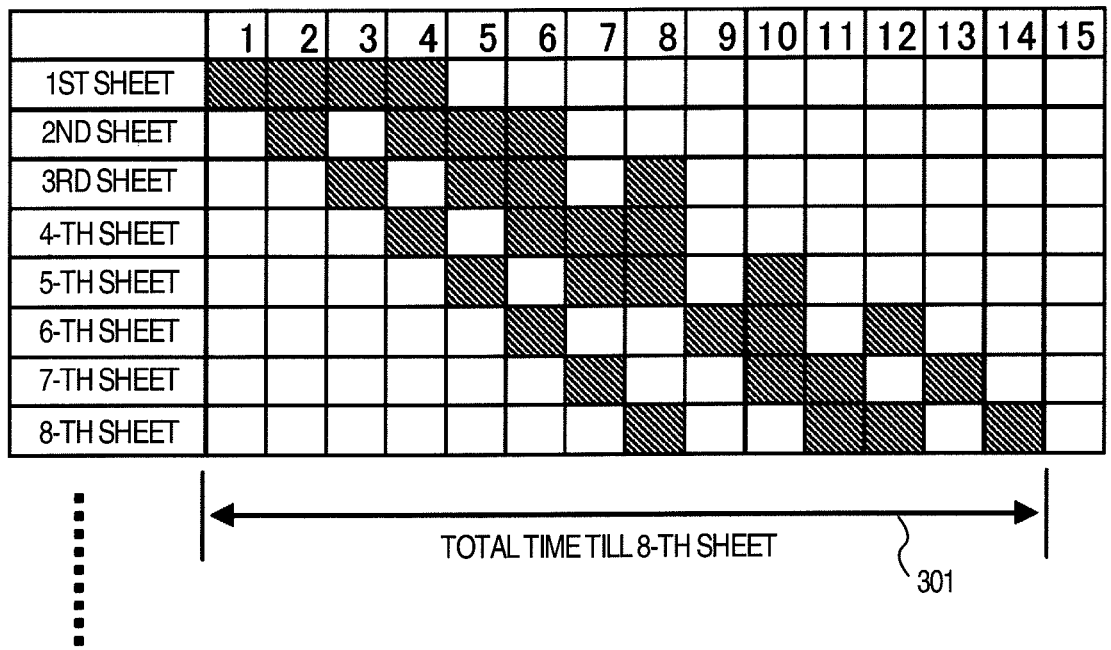
FIG. 3 is a graph diagrammatically showing the status in which the total processing time of wafers increases owing to the occurrence of waiting times in the related art.

The status of the increase in the wafer total process time due to the occurrence of the waiting time in the related art is diagrammatically illustrated in a graph of FIG. 3. In the graph, the whole step per one sheet of wafer is decomposed into four blocks. It is assumed that initially, all of the four steps are processed without waiting time but for the second wafer, a waiting time occurs at the termination of the process of the first one block and a blank time of one block interrupts. For the second wafer process, the blank time of one block, that is, a waiting time of one block prevails but for the next third sheet, the waiting time of one block occurs at the timing corresponding to the above and in addition, a waiting time of one block occurs in the latter half of the process. For the third sheet, in all of the 4 blocks, the waiting time of 2 blocks interrupts, totaling 6 blocks. The process proceeds in sequence in this manner and at the termination of the eighth sheet process, the total time 301 until the eighth sheet amounts to 14 blocks.

Figure 4:
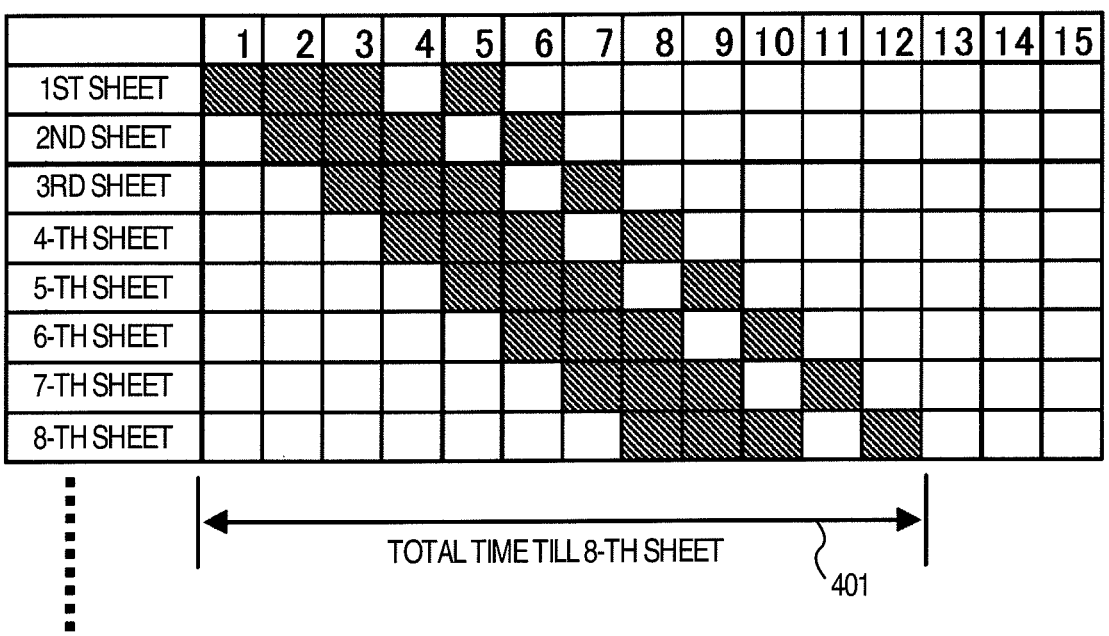
FIG. 4 is a graph diagrammatically showing how the total processing time of wafers changes when the plural wafers are processed with the vacuum processing apparatus according to the present embodiment.

How the total wafer process time changes when the plurality of wafers are processed by the vacuum processing apparatus according to the present embodiment is diagrammatically illustrated in a graph of FIG. 4. In the graph, the total step per one sheet is again decomposed into four blocks as in FIG. 3 but in the vacuum processing apparatus of the present embodiment, the start and end times and timings of each operation and waiting time are scheduled on a timetable and set, with a view to intentionally interrupting a waiting time at the most proper position, and the waiting time is initially merged into the total step per one sheet of wafer.

The present example is described on the assumption that the most proper position lies between the third and fourth blocks but in some case, it is preferable that the waiting time is set between the first and second blocks or between the second and third blocks. The waiting time setting at the proper position referred to herein is materialized by making a scheduling on a timetable such that the process time for respective sheets of wafer covering the initial wafer to the last wafer (total step) ends identically for the individual wafers. When the scheduling is practiced in the aforementioned manner, the total step per one sheet amounts to 5 blocks and if this process proceeds regularly until the eighth sheet, the total time 401 consumed till the eighth sheet amounts to 12 blocks, proving that as compared to the processing method explained initially in connection with FIG. 3, two blocks can be shortened. The shortened block indicates an improved productivity (throughput) in the vacuum processing apparatus.

In the vacuum processing apparatus of the present embodiment, information concerning the time of operation in the flow of process of one sheet of wafer, that is, time of each of the operations of the vacuum processing apparatus covering take-out of a wafer from a cassette and transfer of the wafer to bring the wafer to the original position of the cassette, for example, time required for ventilation in the lock chamber 131, time required for the atmospheric transfer robot 122 to complete one action, time required for the aligner 123 to position the wafer and time for the vacuumized transfer robot 142 to complete one action, is usably provided in advance as data of processing a predetermined number of process target wafers by means of the controller 144 through a communication unit, and an operation unit located in the controller 144 conducts a pre-scheduling by using the information. The operation unit in the controller 144 reads as data the aforementioned information stored in a memory unit through the communication unit and makes a copy of the data which in turn is stored in another memory unit inside the controller 144.

Before processing wafers used for producing a product, at least one separate wafer may be processed with the vacuum processing apparatus of the present embodiment and data indicative of the information as above may be measured and recorded. The vacuum processing apparatus according to the present embodiment includes a detection unit such as a sensor for detecting the operation necessary for recording and in the controller 144, an interface for receiving the output from the detection unit and a timer for measuring time are included.

The data of the aforementioned information also includes information concerning process conditions such as the kind of gas, pressure and time used for a process based on plasma applied to wafers in the processing chambers of individual process units 101*a* to 101*d*. The aforementioned data is captured through a communication unit 143 which communicates with a host computer for adjusting the sequence of process and transfer of individual cassettes of the vacuum processing apparatus, the host computer being located in a housing such as a clean room in which the vacuum processing apparatus is installed. Thus, in the vacuum processing apparatus of the present embodiment, data stored in the controller 144 or at the remote site is used to arrange on a timetable the sequence of start times or end times of the individual operations and combinations of these factors of time and besides specified waiting times before or after these operations, thereby making it possible to calculate a process time per one sheet of wafer and a process time of a predetermined number (for example, one lot or 25 sheets) of wafers.

In the present embodiment, the interval time between the start and end times of each operation is so scheduled as to equal the sum of a time actually required for each operation in the vacuum processing apparatus and a given spare time. By determining the time point and time period of operation in this manner, abnormality during wafer processing of each wafer and the difference and unevenness among individual units can be absorbed and individual operations of processes of individual wafers can be synchronized with one another.

When a plurality of examples of permutation and combination of the operations and waiting times are prepared, the controller 144 uses the start and end times in connection with each example so as to calculate each process time, selects an operation, for which a process time of a predetermined number of wafers is minimized, as a schedule for an operation to be executed and sets it as a setting schedule which in turn is stored in the internal memory unit. Further, on the basis of the information of the setting schedule representing schedule information of operation, the controller issues commands to the vacuum processing apparatus to operate the individual drive units so that the operation may be adjusted. In the pre-scheduling, it is important as described previously that which point the rate-controlling for the productivity or throughput is executed at can be grasped in advance and with the knowledge of the rate-controlling point, the function to make such a scheduling that the point can be operated most efficiently is afforded.

Figure 5:
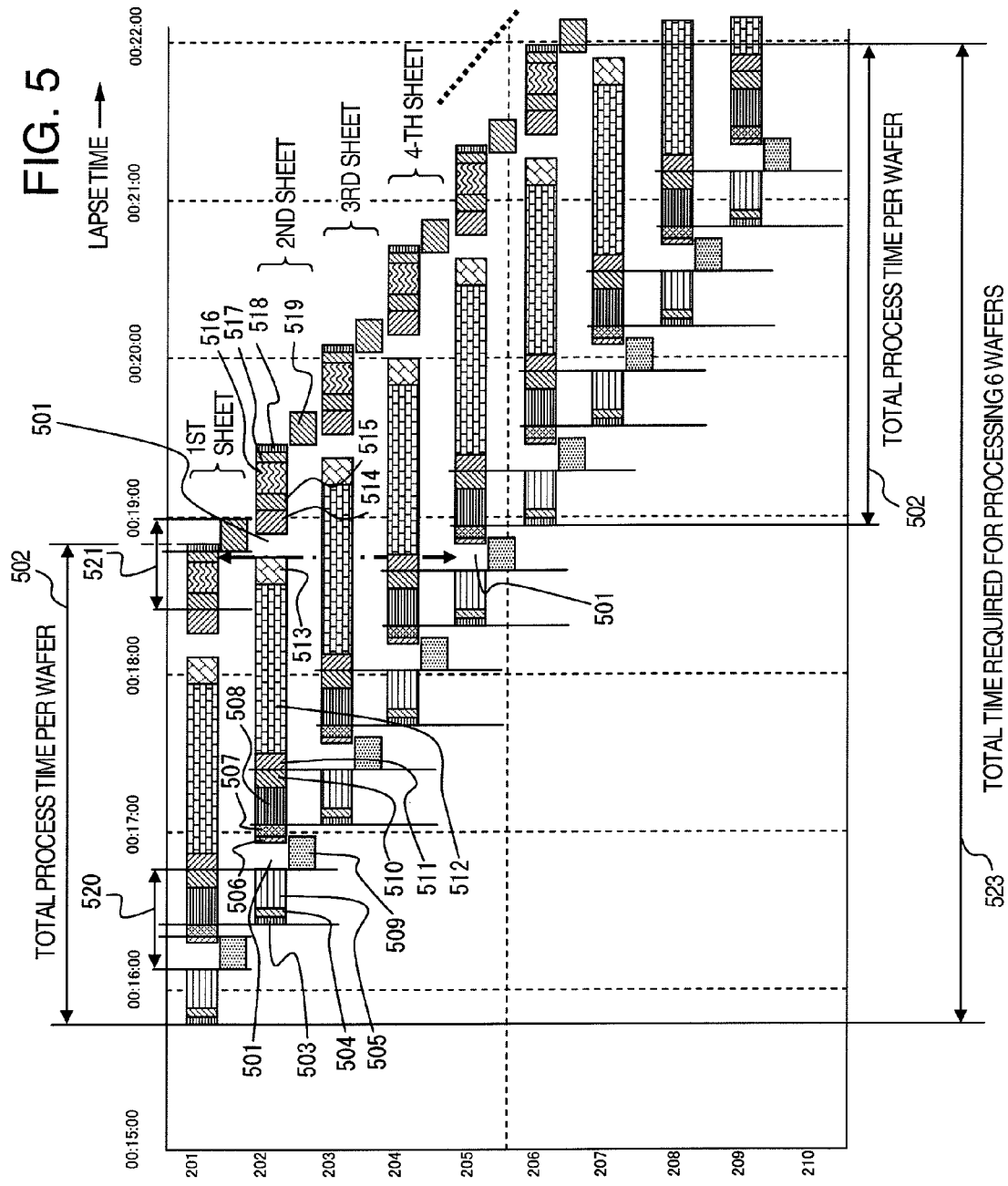
FIG. 5 is a chart showing flow of individual operations when the vacuum processing apparatus shown in FIG. 1 is operated in accordance with the pre-schedule shown in FIG. 4.

Next, the setting schedule will be explained by making reference to FIG. 5. Illustrated in FIG. 5 is a chart showing flow of individual operations when the vacuum processing apparatus shown in FIG. 1 is operated according to the pre-schedule shown in FIG. 4. In the chart, each square-pillar block indicates each operation in the vacuum processing apparatus.

The pre-schedule according to the present embodiment shows a process in which one of the two lock chambers 131 operates limitedly for loading and the other operates limitedly for unloading. More specifically, in the drawing, the lock chambers 131 are used twice in the flow of operation of each wafer processing, so that the interior of one lock chamber 131 is reduced in pressure from atmospheric pressure to vacuum pressure while an unprocessed wafer transferred from the atmospheric environment to the lock chamber being stored therein and the wafer is then transferred to the processing chamber, and the interior of the other lock chamber is raised in pressure to the atmospheric pressure while the wafer transferred from the processing chamber to the lock chamber being stored therein and the wafer is then transferred to the atmospheric side. Operations and functions of the wafer transfer from the atmospheric side to the vacuum side (loading) and of the wafer transfer from the vacuum side to the atmospheric side (unloading) are fixed to the two lock chambers 131, respectively.

An example of operation of the vacuum processing apparatus when the vacuum processing apparatus of the present embodiment applies processes to wafers by using the three process units 101a to 101c will now be described. Especially, a plurality of substantially circular wafers having their surfaces formed with thin film layers of the same structure, respectively, are processed under the same gas and pressure condition in any process units 101a to 101c as will be described by using the operation flow.

In the drawing, time elapses from left to right on abscissa. Ordinate represents each of the plurality of wafers. As shown, operations as indicated by a plurality of square-pillar blocks for the individual wafers are linked intermittently in the figure to operate the wafers.

As mentioned above, in the present embodiment, the shown operation and flow executed for each wafer is common to a plurality of wafers (for example, one lot) and so, in the process of each wafer, the sequence and time of plural operations is identical. In each operation flow, a wafer in the cassette is taken into the interior of the atmospheric side unit through the load port 111 and transferred to any of the processing units 101a to 101c and processed therein and then returned again to the original position in the original cassette.

In this phase, the two lock chambers 131 independently repeat operations of the transfer of the wafer (reception), the interior evacuation (pressure reduction), the take-out of the wafer and the interior vent (pressure rise). Especially, in the present embodiment, the blocks indicative of these operations are linked sequentially.

In the figure, the square-pillar indicating operation of each wafer is illustrated, taking the form of upper and lower two lines. The upper square-pillar indicates operation for handling the wafer and the lower square-pillar indicates operation in the absence of the wafer, that is, operation for not handling the wafer. More specifically, the lower line corresponds to operation in any lock chamber 131, that is, evacuation (pressure reduction) or vent (pressure raising) when no wafer is stored inside the lock chamber.

The vacuum processing apparatus of the present embodiment shown in FIG. 1 comprises one atmospheric transfer robot 122 in the EFEM 121, two lock chambers 131, one vacuumized transfer robot 142 in the vacuum container constituting the vacuumized transfer unit 141, and the process units 101a, 101b, 101c and 101d surrounding the outer periphery of the vacuumized transfer unit 141. Of these process units, process units participating in the operation shown in FIG. 5 are three ones 101a to 101c.

Wafers in a cassette are brought into each of the process units 101a to 101c one by one by means of the one atmospheric transfer robot 122 and the one vacuumized transfer robot 142 and then processed. Individual wafers are directed to one of the process units 101a to 101c predetermined for them and while these wafers being taken out of the cassette with a given time difference, the process starts so that the wafers may be applied with the process in any process units 101a to 101c and may subsequently be returned to the original position in the original cassette at a given time difference.

In the present embodiment, as for the start of process of an arbitrary wafer (take-out from the cassette) and the start of process of the next wafer, the latter initiates after completion of operation 507 for bringing the wafer related to the former to one of the lock chambers 131 which is set for loading.

Further, after an arbitrary wafer is transferred by means of the vacuumized transfer robot 142 to a process unit so as to be processed therein and thereafter operation 515 for bringing the wafer from the process unit to one of the lock chambers 131 which is set for unloading has ended, operation 510, out of operations concerning the fourth one counted from that wafer, for taking out the fourth unprocessed wafer from the lock chamber 131 for loading by means of the vacuumized transfer robot 142 is started. To satisfy this condition, transfer of each wafer from the cassette is started with the same given time difference. This is because only one vacuumized transfer robot 142 is provided in the vacuumized transfer unit 141 and its rotary shaft is fixedly positioned in the center of the vacuum container and consequently, the wafer reception and transfer between two lock chambers 131 cannot be effected in parallel.

In the figure, the initial operation is operation 503 in which the atmospheric transfer robot 122 takes out a given wafer from the cassette by way of the load port 111 and brings it to the EFEM 121. Subsequently, the atmospheric transfer robot 122 transfers the held wafer to the aligner 123 inside the EFEM 121 to deliver it onto the aligner (operation 504).

The wafer carried on the aligner 122 and held thereby is adjusted for its center position and direction by means of the aligner 122 (operation 505). Thereafter, the wafer is again taken out of the aligner 122 by means of the atmospheric transfer robot 121 (operation 506) and transferred to the interior of one of the two lock chambers 131 having its function set for loading and having its interior being opened to the interior of EFEM 121 at atmospheric pressure, so as to be delivered to the internal sample holder and held thereby (507).

One gate valve of the lock chamber 131 is closed and the closed interior is evacuated to a reduced pressure equivalent to the interior of vacuumized transfer unit 141 (operation 508). With the pressure reduction to the given pressure detected, the internal gate valve of vacuumized transfer unit 141 is opened and the vacuumized transfer robot 142 receives the wafer from the interior of the one lock chamber 131 (operation 510).

Structurally, in the present embodiment, before the time that the interior of the one lock chamber 131 is opened to the interior of EFEM 121 to thereby make communication therewith, the vent operation for raising the pressure in the interior of the one lock chamber 131 to the atmospheric pressure has been effected in advance (operation 509) and as soon as the operation 509 ends, the gate valve is opened immediately to permit the atmospheric transfer robot 122 to transfer the wafer.

The vacuumized transfer robot 142 in receipt of the wafer responds to a command from the controller 144 to bring the wafer to the interior of predetermined one of the process units 101a to 101c while carrying it on the arm and delivers it to the sample stage located in the internal processing chamber (operation 511). The one of the process units 101a to 101c in receipt of the wafer closes the gate valve disposed between the vacuumized transfer unit 141 and the processing chamber to hermetically seal the interior of processing chamber and holds the wafer on the sample stage by absorption based on static electricity, thus applying a process to the held wafer under a predetermined condition (operation 512). When the process ends, the static electricity is removed (operation 513).

Thereafter, the gate valve is opened and the vacuumized transfer robot 142 intrudes to the interior of the processing chamber and receives the processed wafer from the sample stage (operation 514). Further, in the transfer chamber inside the vacuum container of the vacuumized transfer unit 141, the vacuumized transfer robot 142 transfers the wafer to the interior of the other lock chamber 131 having the function set for unloading while carrying the wafer on the arm and delivers the wafer onto the internal sample stage (operation 515).

With the wafer delivered onto the sample stage, the gate valve of the lock chamber 131 on the side of vacuumized transfer unit 141 is closed to hermetically seal the interior of the lock chamber which is subsequently raised to the atmospheric pressure (operation 516). When the interior is raised in pressure equivalently to the atmospheric pressure, it is detected and then, the gate valve of the other lock chamber 131 facing the interior of the EFEM 121 is opened to permit the atmospheric transfer robot 122 to intrude to the interior of the other lock chamber 131 and to receive the processed wafer from the internal sample stage (operation 517). The atmospheric transfer robot 122 receiving the wafer transfers it through a space inside the EFEM 121 while carrying it on the arm and stores the wafer at the original position inside the original cassette through the load port 111 (operation 518). After completion of the operation 517, the gate valve of the other lock chamber 131 facing the interior of the EFEM 121 is closed immediately to seal the interior hermetically and the other lock chamber 131 is evacuated and reduced in pressure for storage of the next wafer (operation 519).

As described above, while the process using a plasma is applied to the film layer on the surface of the wafer in the process units 101a to 101c, the gate valve of the other lock chamber 131 facing the transfer space (transfer chamber) inside the vacuum container of vacuumized transfer unit 141 is opened and the interior of the lock chamber is reduced in pressure to a vacuum degree equivalent to that in the transfer chamber. Under this condition, the processed wafer is taken into the interior of the lock chamber by means of the vacuumized transfer robot 142 and is delivered from the arm thereof onto the sample stage (operation 515), the interior of the lock chamber is closed and sealed hermetically and then raised in pressure (vent) (operation 516) and then opened to the atmosphere, followed by delivery of the wafer to the atmospheric transfer robot 122 (operation 517). Thereafter, the interior of the lock chamber is again sealed hermetically and evacuated (reduced in pressure) (operation 519). The above operations are carried out sequentially. In the figure, these operations are indicated by a plurality of blocks each having a plurality of sequential square-pillars.

Especially, according to the present embodiment, in the processes of a plurality of wafers included in one lot, time and sequence of handling and non-handling of the wafers in the operations 503 to 519 as above are so scheduled in advance as to be identical for the process of each wafer. Namely, in each of the processes of the plural wafers, the blocks corresponding to the operations of the one lock chamber 131 set for loading are linked sequentially.

As soon as the operation 510 of taking out (carrying out) the unprocessed wafer from the interior of the one lock chamber 131 and transferring it to the vacuumized transfer unit 141 by means of the vacuumized transfer robot 142 in the course of the flow of wafer processing operation has ended, the operation 509 of raising the one lock chamber 131 in pressure to the atmospheric pressure (vent) in the flow of the next wafer operation starts. In this manner, the blank time incapable of contributing to the process can be reduced.

Similarly, for the other lock chamber 131 set for unloading operation, in each of the operations associated with a plurality of wafers, the operation (515) of taking in the processed wafer to the interior of the other lock chamber by means of the vacuumized transfer robot 142, the operation (516) of raising the interior in pressure (vent) while hermetically sealing the lock chamber 131 storing the wafer and the operation (517) for causing the atmospheric transfer robot 122 to take out the wafer from the interior to the EFEM 121 when the interior reaches the pressure equivalent to the atmospheric pressure are linked sequentially, and the sequence and time of these operations are the same in common to the plurality of wafers.

In the operation of the other lock chamber 131, too, at the termination of the operation 519 for vacuum evacuation of the other lock chamber 131 associated with the process of the preceding wafer, carrying the processed wafer to the other lock chamber 131 by means of the vacuumized transfer robot 142 is started in association with the process of the wafer to be processed next. In this manner, according to the present embodiment, the plurality of operations 515 to 519, inclusive of handling and non-handling the wafer, of the other clock chamber 131 are so set as to proceed sequentially through the pre-scheduling in the controller 144, so that during these operations for the wafer, handling a different wafer by means of the atmospheric transfer robot 122 and the vacuumized transfer robot 142 does not interrupt, except for handling in the process units 101a to 101c, aligner 123 and the one lock chamber 131. Thanks to the linkage of operations as above, waiting time not contributing to the wafer processing (blank time) can be reduced.

Further, in the flow of operation for each wafer scheduled in advance according to the present embodiment, the waiting time is arranged during particular operations carried out in association with the one lock chamber 131 and the other lock chamber 131, that is, the waiting time is arranged in front of the operation 507 and 515 for taking in the unprocessed wafer to the lock chamber 131 by means of the atmospheric transfer robot 122 and taking out the processed wafer from the lock chamber 131 by means of the vacuumized transfer robot 142. More specifically, the waiting time is placed in front of the operation 506 (reception of the unprocessed wafer from the aligner 123 by means of the atmospheric transfer robot 122) which links to the operation 507 frontally thereof. Also, the waiting time is placed in front of the operation 514 (reception of the processed wafer from the process unit by means of the vacuumized transfer robot 142) which links to the operation 515 frontally thereof. In this manner, synchronization is set up with the operation of processing the different wafer, thereby preventing the operations of the single atmospheric transfer robot 122 and the single vacuumized transfer robot 142 from overlapping, prosecution of which operations is demanded by the individual wafer processes.

Taking the waiting time 501 in front of the operation 507 (inclusive of operation 506) of the sixth wafer, for instance, in order that the operation 507 (operation 506) by means of the atmospheric transfer robot 122 in the process of this wafer does not overlap the operations 517 and 518 associated with the first wafer, the waiting time 501 provides a time difference between start times of these operations. More specifically, in order for the operation associated with the fifth wafer to wait for the end of the operation associated with the first wafer, the aforementioned time not handling the fifth wafer is arranged. In other words, the waiting time 501 is the time for awaiting the end of the operation associated with the different wafer. To add, the operation 506 does not directly participate in the operation of the lock chamber 131 and therefore, this operation is not necessarily provided immediately before the operation 507 and may be arranged at any time point within the waiting time 501 shown in the figure, provided that this operation does not interfere with the take-out operation of the first wafer by means of the atmospheric transfer robot 122.

Similarly, as for the waiting time 501 in front of the operation 515 associated with processing of the first wafer, in order that the operation 515 (514) executed by the vacuumized transfer robot in association with processing of this wafer does not overlap the operation 507 or 508 associated with processing of the third wafer, the waiting time 501 provides a time difference between start times of these operations. More specifically, in order for the operation associated with the third wafer to wait for the end of the operation associated with the first wafer, the time not handling the wafer is arranged.

According to the present embodiment, in the respective blocks showing the operations associated with the process of each wafer, the length in the abscissa direction of each of the blocks indicates the length of time of individual operations performed by driving components corresponding to these operations in the vacuum processing apparatus such as the atmospheric transfer robot 122, aligner 123, lock chamber 131, vacuumized transfer robot 142 and process units 101a to 101c, respectively. In the present embodiment, in each block, each of the aforementioned components will not be driven over the full length of the block.

Namely, the length of block in the abscissa direction indicates an allotted time required by the controller 144 in order for each component to start and then stop each operation and so, the controller 144 designates each operation time such that a given short period of time prevails before or after each operation. The marginal short period of time is advantageous for causing a required operation to end within an allotted time even in the event that an uncontrollable abnormality or delay is caused in each operation. Further, in case the delay and abnormality or the difference in operation start/end time may be caused or expected to take place, the operation start or end time may be so set as to gain or lose within the operation time allotted to an arbitrary operation by means of the controller and the controller may issue a command correspondingly.

According to the pre-schedule of the present embodiment, especially, in the schedule set as shown in FIG. 5, the waiting time 501 is so scheduled as to be arranged before the take-in of wafer to the lock chamber 131 and immediately after the end of wafer processing in any of the process units 101a to 101d. Further, in the case of the waiting time 501 preceding the take-in of the wafer to the lock chamber 131, the operation of vacuum evacuation in the lock chamber 131 proceeds while the wafer being stagnated on the aligner 123 during the wafer waiting time 501 and in addition, at least part of the vacuum evacuation operation proceeds in parallel with the time of transfer of the wafer from the aligner 123 to the lock chamber 131.

Furthermore, the waiting time 501 is arranged in front of the operation 507 or 515. Such a waiting time may also be placed after the operation 510 of taking out the unprocessed wafer from the one lock chamber 131 by means of the vacuumized transfer robot 142 or the operation 517 of taking out the processed wafer from the other lock chamber 131 by means of the atmospheric transfer robot 122. In the present embodiment, the preference is made of the fast processing of the wafer in the process unit and therefore, no waiting time is placed after the operation 510 or 517.

The waiting time is arranged before and after the operations 507 to 510 and the operations 515 to 517 associated with the two lock chambers 131. Especially, the waiting time is placed in front of each of the operations 507 and 515.

By virtue of the waiting time, synchronization with the operation associated with the processing of a different wafer can be adjusted and besides the difference in schedule of each operation associated with wafer processing for which schedule is set in advance can be adjusted. By setting the pre-schedule such that the waiting time is included in the flow of operation of each wafer, a delay in the operation can be adjusted within the waiting time and the operation following the waiting time can be returned to a schedule meeting the intension.

Further, by arranging the waiting time before the operation of the lock chamber 131 which impersonates a rate-controlling in the process for the plural wafers shown in FIG. 5, especially, immediately before the first one of the plural operations associated with the lock chamber 131 which are linked sequentially, a delay in the start of the operation of lock chamber 131 impersonating the rate-controlling operation can be suppressed, improving the efficiency of wafer processing and improving the yielding of the vacuum processing apparatus and the efficiency of semiconductor device production as well.

In each operation, there is the possibility that unavoidable events such as the uncontrollable delay and unexpected inconvenience will occur as described previously. In the related arts, delays in operation caused by such events are cumulated to grow, resulting in an unexpected large waiting time.

It can be expected that such an adverse influence can be reduced by providing a time capable of absorbing the aforementioned difference, so called a time for buffering in the flow of operation of processing wafers. In the related arts, however, the order of operations the transfer unit performs is determined such that wafers are transferred sequentially starting from a wafer being ready for transfer, that is, on the basis of the so-called event drive method, having difficulties in setting in advance what time and where the waiting time is to be arranged.

On the other hand, since in the present embodiment the same schedule is set in advance for the process of a plurality of wafers, a waiting time of a specified length can be arranged before a specified operation. Especially, the waiting time can be arranged before start of the operation impersonating rate-controlling, thereby realizing the highly efficient process.

Further, the operation of the next wafer process is started after the operation of vacuum evacuation of lock chamber 131 in the process of the preceding wafer in execution ends. By doing so, in the flow of process operation of an arbitrary wafer, the operation of vacuum evacuation of lock chamber 131 impersonating the rate-controlling can be suppressed from being interfered with the process of another wafer and the operation of the lock chamber 131 can be operated smoothly to thereby improve the efficiency of the operation.

Also, the operation of one lock chamber 131 associated with the process of a wafer next to an arbitrary wafer is started after the operation of the lock chamber 131 associated with the process of the arbitrary wafer ends. Especially, immediately after the loading operation 510 the loading lock chamber 131 executes has ended, the operation 509 for vent associated with the process of the next wafer is started.

The operations 509, 507, 508 and 510 of the one lock chamber 131 are linked sequentially, forming a series of operations. In other words, during these operations, especially, during the operations 507 to 510 for handling the wafer, no time is roomed for the operation associated with the process of another wafer. This holds true for the operations 515 to 517 and 519 of the other lock chamber 131. In this manner, the efficiency of the operation of lock chamber 131 impersonating the rate-controlling of process can be improved, thus sympathetically improving the efficiency of the process of a plurality of wafers by the vacuum processing apparatus and the efficiency of production of semiconductor devices.

By setting the time of each operation (start time, end time) inclusive of the waiting time 501 as above and the order of the operations, the flow of operation of processing individual wafers can be operated as scheduled. Also, by setting the waiting time in advance and scheduling it for arrangement in the operation flow, it is possible to set up the synchronization with the flow of operation of another wafer proceeding executed in parallel in the waiting time 501. Through this, even when processes of plural wafers are carried out in parallel, the step per one wafer (time consumed for processing) can be matched and the plural wafer processes can be proceeded with in regular condition. Further, by using the method of pre-scheduling, the productivity can be improved.

In addition, through the pre-schedule, the end times of processes of the plural wafers can be predicted accurately. As a result, occurrence of wasteful time consumed in preparation for the next cassette and preparation for the next lot under the command of the controller 144 can be suppressed and the production efficiency can be improved.

In the present embodiment, the flow, time and order of individual operations associated with the process per one sheet of wafer are common to those in the case of a given number of plural wafers and the processing time 502 for one sheet is longer than the shortest processing time per one sheet based on the related arts. On the other hand, the time required for processing a given number of plural wafers is shorter in the present embodiment than in the related arts. Namely, in the status described in connection with FIG. 2, the total time consumed for processing 6 wafers was 550 seconds but when the process to which the present invention explained in connection with FIG. 5 is applied is practiced, processing 6 wafers is completed by a total consumption time of 480 seconds. This means an improvement in the productivity or throughput by about 15%. Actually, it was confirmed that when 25 wafers were processed, an improvement in the productivity by 40% or more could be achieved.

Conceivably, when the two lock chambers are operated for any of loading and unloading (parallel operation), the operation impersonating the rate-controlling of the wafer processing will sometimes differ from that in the present embodiment shown in FIG. 4 or 5. For example, in the example of FIG. 4 or 5, one of operations impersonating the rate-controlling is the vacuum evacuation of the one lock chamber but this will not sometimes impersonate the rate-controlling in the parallel operation. Such a case will be explained by using FIGS. 6 to 8.

Figure 6:
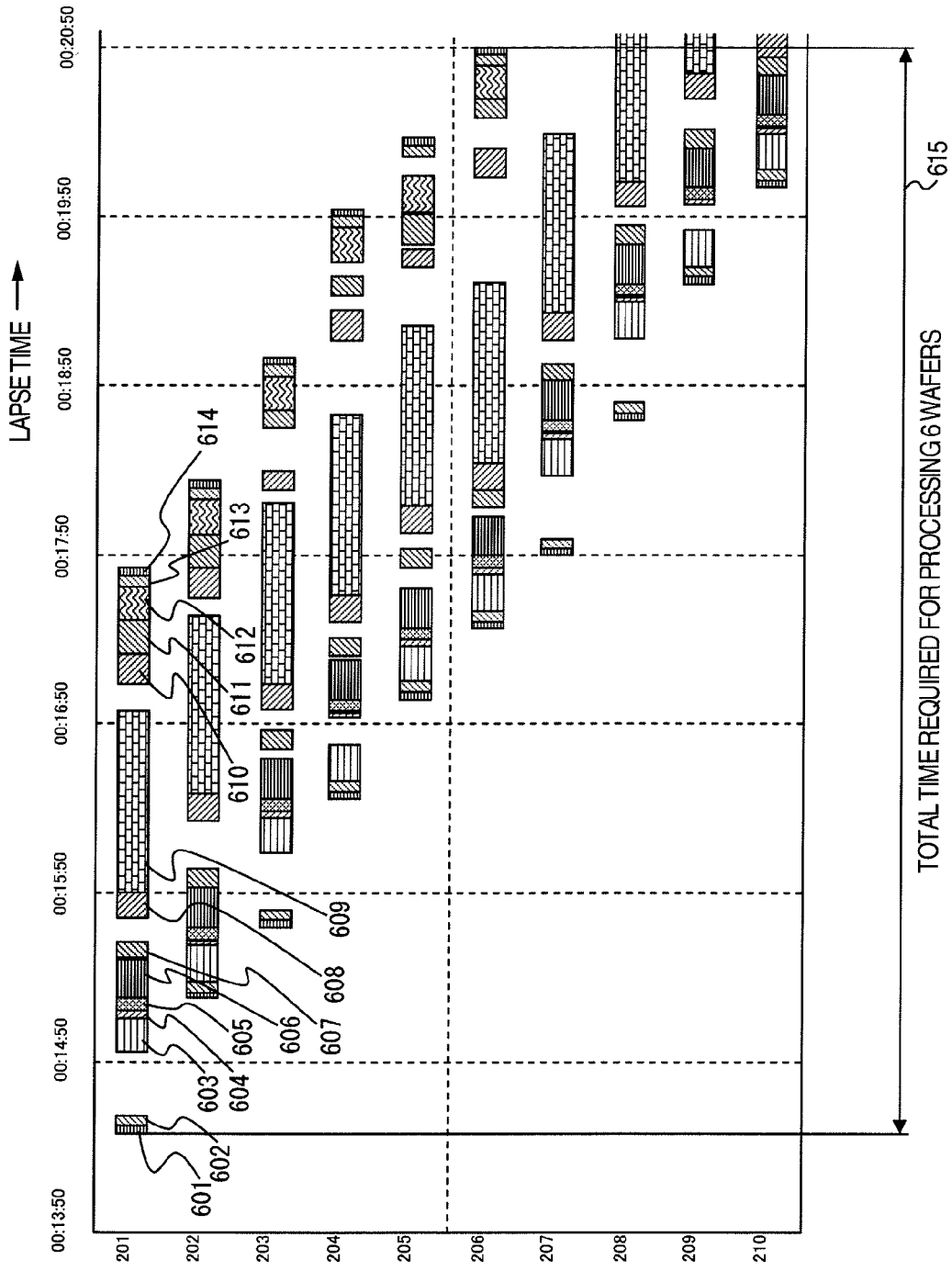
FIG. 6 is a chart showing flow of operations when the parallel operation is carried out in the vacuum processing apparatus of related arts having the same number of atmospheric side transfer units, vacuum side transfer units and process units as those in the vacuum processing apparatus of the present invention.

Illustrated in FIG. 6 is a chart showing flow of process operations when the parallel operation is executed in the vacuum processing apparatus of related art having the same number of atmospheric side transfer units, vacuum side transfer units and process units. In the figure, like FIG. 5, each of the square-pillar blocks in the chart indicates each of the operations in the vacuum processing apparatus.

In the example, since the two lock chambers 131 can be operative in two directions of loading and unloading, both the lock chambers 131 will sometimes operate for loading or unloading at a time. In other words, the wafer transfer faculty of the lock chamber 131 is promoted.

As the transfer faculty of the lock chamber 131 increases in this manner, the operation in the wafer transfer responsible for the rate-controlling changes. In the embodiment shown in FIG. 5, one of the two lock chambers 131 is fixedly used for loading with the other fixedly used for unloading, causing the operation in the lock chamber 131 to impersonate the rate-controlling operation but in the example shown in FIG. 6, an instance is illustrated in which the operation of the vacuumized transfer robot 142 impersonates the rate-controlling operation.

Then, illustrated in FIG. 6 is the flow of operations associated with the processing of plural wafers in the parallel operation as above by the vacuum processing apparatus of related art. Accordingly, the operation is of the event driven type and the waiting time occurs randomly.

The flow of operations associated with the process of each wafer shown in FIG. 6 is equivalent to that in the example shown in FIG. 5 and from left to right in the drawing, the operation proceeds. Each wafer is taken out of a cassette by means of the atmospheric transfer robot 122 and brought into any of the lock chambers 131 via the aligner 123 and thereafter, the interior of the lock chamber 131 is reduced in pressure and the wafer is taken out by means of the vacuumized transfer robot 142 and transferred to given any process units 101*a* to 101*c* so as to be applied with a process therein. Subsequently, the processed wafer is taken out of the process unit by means of the vacuumized transfer robot 142 and delivered to any lock chamber 131. Then, while the wafer received by the lock chamber 131 being stored therein, the interior of lock chamber 131 is vented and raised in pressure so as to be opened to the atmosphere and thereafter, the processed wafer is returned from the interior of lock chamber 131 to the original position of the original cassette.

Figure 7A:
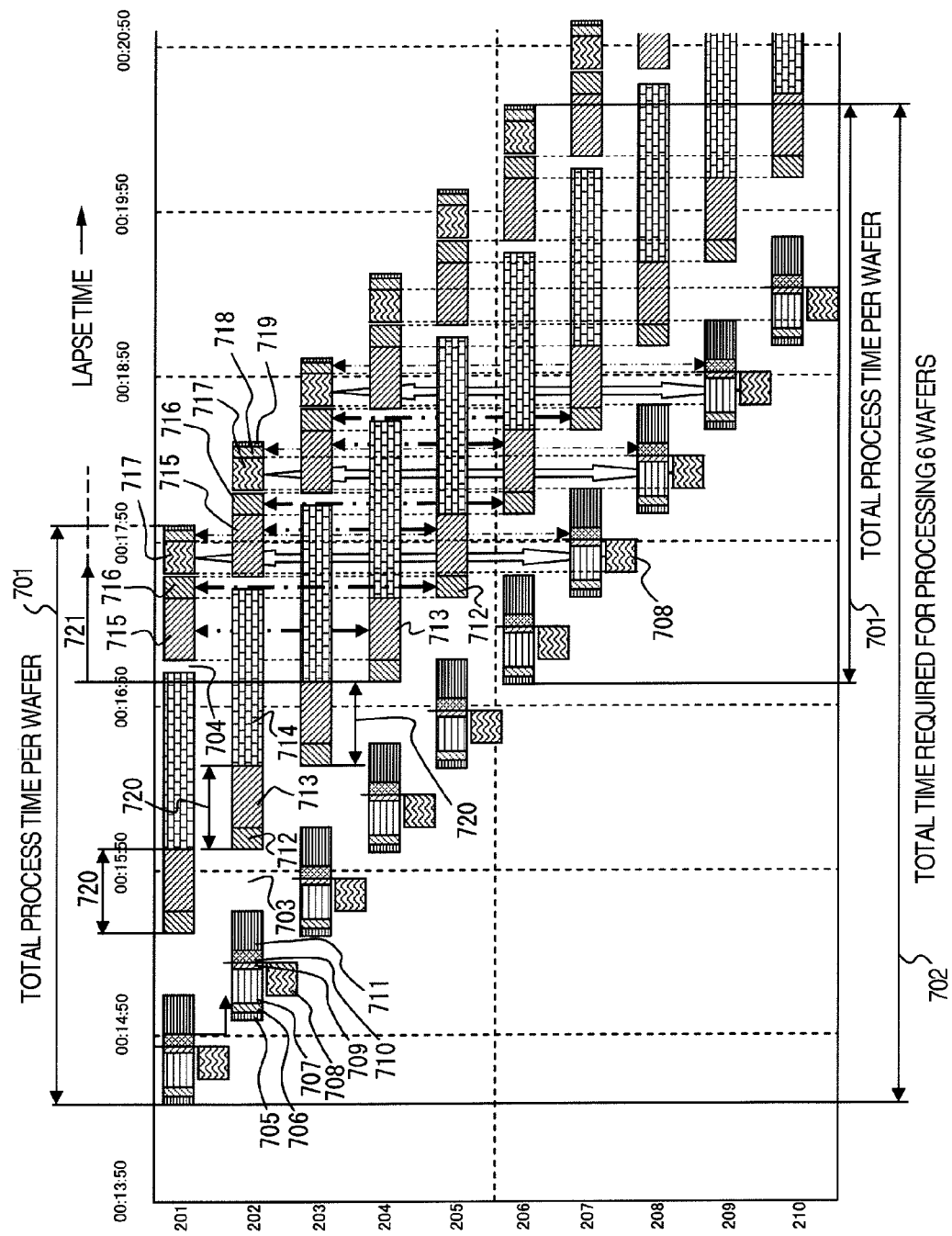
FIG. 7A is a chart showing another embodiment of flow of operations in the vacuum processing apparatus of the invention.
Figure 7B:
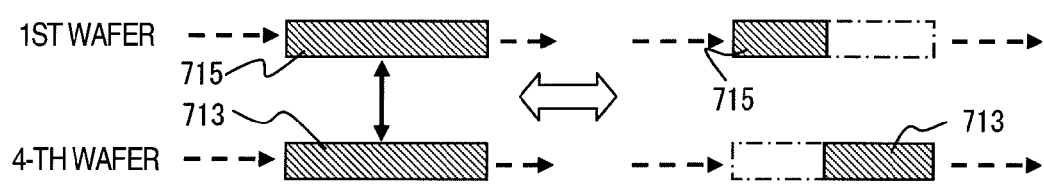
FIG. 7B is a diagram useful in explaining the FIG. 7A chart.

Turning to FIGS. 7A and 7B, the pre-scheduling when a plurality of wafers are processed in the case of the parallel operation similar to FIG. 6 with the vacuum processing apparatus will be described by using a chart of operation flow according to another embodiment of the invention. In the figure, the operation of each wafer is illustrated in the form of the square-pillar which is decomposed into upper and lower two lines. The upper line indicates operation for handling the wafer and the lower line indicates operation in any lock chamber 131, that is, evacuation or vent, resembling FIG. 5.

In the present embodiment, each of the atmospheric transfer robot 122 and vacuumized transfer robot 142 includes two arms each being telescopic and being capable of changing its direction while carrying a wafer thereon. Structurally, by using the robot of this type, interchange between one processed wafer and the other unprocessed wafer can be executed on the sample stage in the process units 101*a* to 101*c* or in the two lock chambers 131, thus permitting the so-called pick and load operation. In the operation for interchange between the wafers on the sample stage, the processed wafer is first taken out preferentially and carried on one arm and then the unprocessed wafer on the other arm is delivered onto the sample stage.

In the present embodiment, too, the waiting time is arranged in the flow of operation associated with the process of each wafer and in this example, waiting time 703 or 704 is placed before or after the operation of vacuumized transfer robot 142 impersonating the rate-controlling operation and especially, the waiting time is placed frontally of the rate-controlling. More specifically, the waiting time 703 is located before the operation of vacuumized transfer robot 142 for taking out the unprocessed wafer from any lock chamber 131, the waiting time 704 is located before the operation of taking out the processed wafer from the process unit and a waiting time is also located after the operation for bringing the processed wafer into the lock chamber. Because of the preferential handling of the process of the unprocessed wafer, no waiting time is arranged after the operation of delivering the unprocessed wafer to any process units 101*a* to 101*c*.

According to the present embodiment, like the embodiment shown in FIG. 5, one atmospheric transfer robot 122, one vacuumized transfer robot 142, two lock chambers 131 and three process units 101*a* to 101*c* are used and transfer of a plurality of wafers from a cassette is started with time difference. In the pre-schedule in this example, in order for the wafer to be transferred inside the EFEM 121 by means of the one atmospheric transfer robot 122, after the operation of atmospheric transfer robot 122 ends in association with the process of the preceding wafer, the operation of the atmospheric transfer robot 122 starts in association with the process of the succeeding wafer.

The operation for the process of each wafer in the present embodiment is equivalent to that in the embodiment shown in FIG. 5 and from left to right in the drawing, each wafer is taken out of a cassette by means of the atmospheric transfer robot 122 and brought into any lock chamber 131 via the aligner 123 and thereafter, the interior of the lock chamber 131 is reduced in pressure and the wafer is taken out by means of the vacuumized transfer robot 142 and transferred to given any process units 101*a* to 101*c* so as to be applied with a process therein. Subsequently, the processed wafer is taken out of the process unit by means of the vacuumized transfer robot 142 and delivered to any lock chamber 131. Then, while the wafer received by the lock chamber 131 being stored therein, the interior of lock chamber 131 is vented and raised in pressure so as to be opened to the atmosphere and thereafter, the processed wafer is returned by means of the atmospheric transfer robot 122 from the interior of lock chamber 131 to the original position of the original cassette.

In the figure, the initial operation for this is the operation 705 in which the atmospheric transfer robot 122 takes out a given wafer from the cassette by way of the load port 111 and brings it to the EFEM 121. Subsequently, the atmospheric transfer robot 122 transfers the held wafer to the aligner 123 inside the EFEM 121 to deliver it onto the aligner (operation (706).

The wafer carried on the aligner 122 and held thereby is adjusted for its center position and direction by means of the aligner 122 (operation 707). Thereafter, the wafer is again taken out of the aligner 122 by means of the atmospheric transfer robot 121 (operation 709) and transferred to the interior of one of the two lock chambers 131, the interior of which is raised to atmospheric pressure and opened to the interior of EFEM 121, so as to be delivered to the internal sample holder and held thereby (710).

One gate valve of the lock chamber 131 is closed and the closed interior is evacuated to a reduced pressure equivalent to the interior of vacuumized transfer unit 141 (operation 711). With the pressure reduction to the given pressure detected, the gate valve to the interior of vacuumized transfer unit 141 is opened and the vacuumized transfer robot 142 receives the wafer from the interior of the one lock chamber 131 (operation 712). Structurally, in the present embodiment, before the time that the interior of the one lock chamber 131 is opened to the interior of EFEM 121 to thereby make communication therewith, the vent operation for raising the pressure in the interior of the one lock chamber 131 to the atmospheric pressure has been conducted in advance (operation 709) and as soon as the operation 709 ends, the gate valve is opened immediately to permit the atmospheric transfer robot 122 to transfer the wafer.

The vacuumized transfer robot 142 in receipt of the wafer responds to a command from the controller 144 to bring the wafer to the interior of predetermined one of the process units 101*a* to 101*c* while carrying it on the arm and delivers it to the sample stage located in the internal processing chamber (operation 713). The one of the process units 101*a* to 101*c* receiving the wafer closes the gate valve disposed between the vacuumized transfer unit 141 and the processing chamber to hermetically seal the interior of processing chamber and holds the wafer on the sample stage by absorption based on static electricity, applying a process to the held wafer under a predetermined condition (operation 714).

Thereafter, the gate valve is opened and the vacuumized transfer robot 142 intrudes to the interior of the processing chamber and receives the processed wafer from the sample stage (operation 715). Further, the vacuumized transfer robot 142 transfers the wafer to the interior of the other lock chamber 131 through transfer chamber inside the vacuum container of vacuumized transfer unit 141 while carrying the wafer on the arm and delivers the wafer onto the internal sample stage (operation 716).

With the wafer delivered onto the sample stage, the gate valve of the other lock chamber 131 on the side of vacuumized transfer unit 141 is closed to hermetically seal the interior of the lock chamber which is subsequently raised to the atmospheric pressure (operation 717). When the interior is raised in pressure equivalently to the atmospheric pressure, it is detected and then, the gate valve of the other lock chamber 131 facing the interior of the EFEM 121 is opened, then permitting the atmospheric transfer robot 122 to intrude to the interior of the other lock chamber 131 and to receive the processed wafer from the internal sample stage (operation 718). The atmospheric transfer robot 122 in receipt of the wafer transfers the wafer through a space inside the EFEM 121 while carrying it on the arm and stores the wafer at the original position inside the original cassette through the load port 111 (operation 719).

The time and order of these operations are made to be identical for the individual processes of the plural wafers in one lot by adding the time difference by means of the controller 144 through the pre-scheduling. Namely, in the present embodiment, for individual wafers in one lot, the process flow is scheduled identically.

In the schedule according to the present embodiment, the plural operations of the vacuumized transfer robot 142 which impersonate the rate-controlling are linked sequentially, so that the efficiency of the operation can be improved, leading to improvements in the operation efficiency of the vacuum processing apparatus, the efficiency of processing and efficiency of production of semiconductor devices.

In realizing the sequential operation of the vacuumized transfer robot 142, the operation of vacuumized transfer robot 142 is interchanged between operations associated with different wafer processes. Namely, operation 715 associated with the process of the first wafer (operation for taking out the processed wafer from the process unit by means of the vacuumized transfer robot 142) is interchanged with operation 713 associated with the fourth wafer (operation for transferring an unprocessed wafer to deliver it onto the sample stage in the process unit), thus performing interchange between the processed and unprocessed wafers.

The interchange operation is also carried out between the operation 716 associated with the process of the first wafer (operation for transferring the processed wafer to any lock chamber 131) and the operation 712 associated with the process of the fifth wafer (operation for taking out the unprocessed wafer from any lock chamber 131 by means of the vacuumized transfer robot 142).

Further, transfer (loading) of the fourth wafer to any of the process units 101*a* to 101*c* is carried out after take-out of the first wafer. Accordingly, vent operation (operation 717) in the lock chamber 131 for unloading in association with the process of the first processed wafer is shared by vent operation 708 in the lock chamber 131 for loading the seventh unprocessed wafer to the vacuumized transfer unit 141.

FIG. 7B is useful to explain flow of the interchange operation of the vacuumized transfer robot 142 and the atmospheric transfer robot 122 in connection with the chart of FIG. 7A. The operation for performing interchange between processed and unprocessed wafers in FIG. 7A is illustrated on the left side in FIG. 7B but actually, as illustrated on the right, the atmospheric transfer robot 122 or vacuumized transfer robot 142 receives the processed wafer from the sample stage and takes it out by using one arm not carrying any wafer and then the unprocessed wafer carried on the other arm is delivered to the sample stage by using the other arm carrying it.

The interchange operation is carried out between the operation 715 of vacuumized transfer robot 142 associated with the process of an arbitrary wafer on the drawing and the operation 713 associated with the process of another wafer to be processed later, between operations 716 and 712 and between operations 719 and 710 by the atmospheric transfer robot 122. In all of the interchange operations, the operation for taking out the processed wafer is preferential in the present embodiment.

Figure 8:
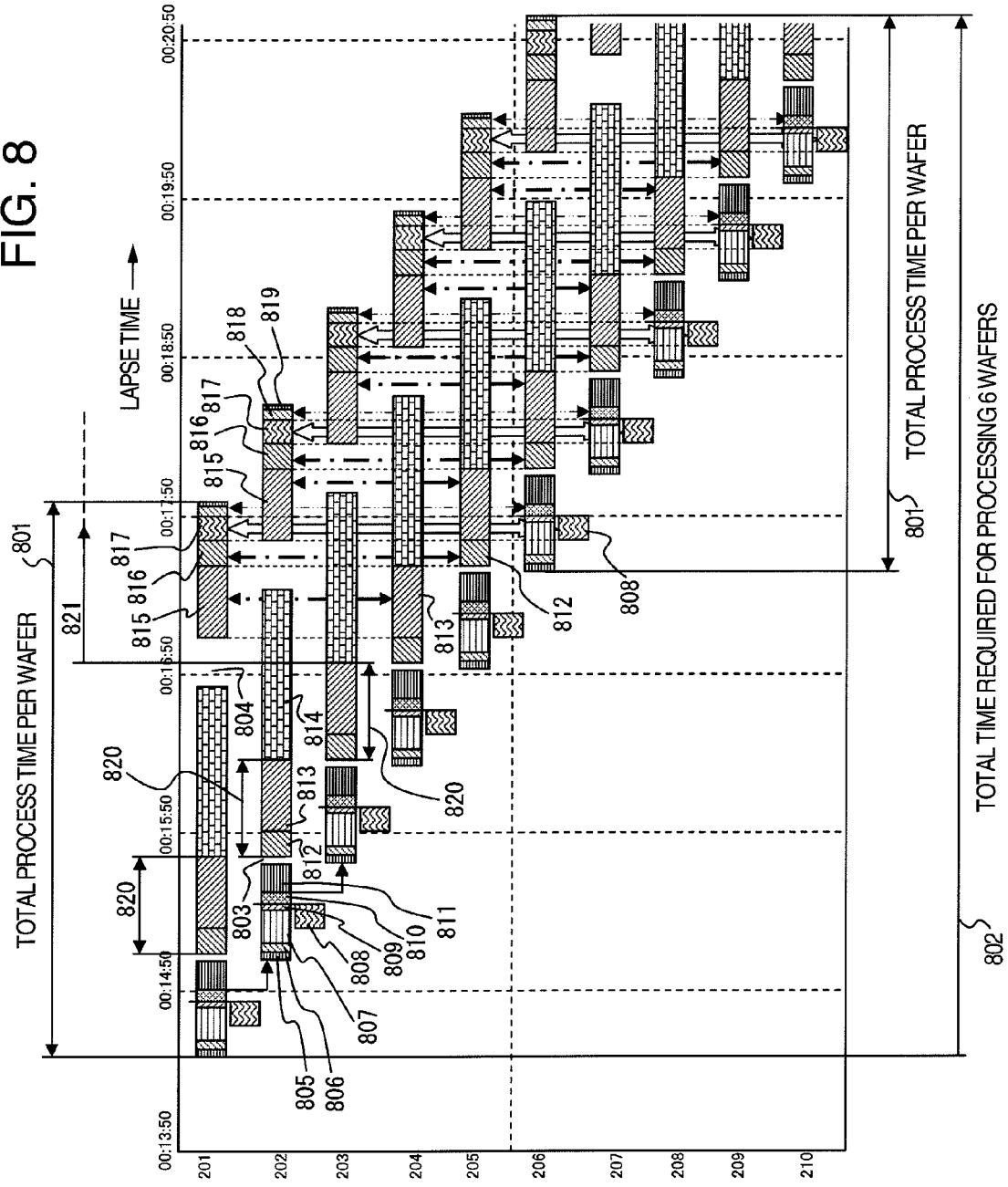
FIG. 8 is a chart showing an example of flow of operations in the vacuum processing apparatus modified from the FIG. 7A embodiment.

In the present embodiment, the interchange is conducted by means of the vacuumized transfer robot 142 between the process associated with the first wafer and the processes associated with the fourth and fifth wafers and the interchange sharing the vent operation by means of the atmospheric transfer robot 122 is executed between the processes associated with the first and seventh wafers. In the processes of the second and ensuing wafers, the process keeps continuing by maintaining the difference in sheet number. In the figure illustrative of the present embodiment, the length in the abscissa direction of each operation is allotted as corresponding to a time within which the respective components associated with an operation of interest fully completes the operation and the controller 144 calculates the pre-schedule and makes commands such that spare times are arranged between drive times of the individual components or before and after each drive time. In this respect, an example shown in FIG. 8 is also similar to that in FIG. 5.

In the present embodiment, too, like the embodiment shown in FIG. 5, synchronization between operations associated with the precedently processed wafer and the successively processed wafer can be set up by arranging waiting time 703 or 704 before or after the operation impersonating the rate-controlling operation. Uncontrollable shifts from the pre-schedule can be absorbed by the blank time 703 or 704 to suppress the occurrence of a delay in the later operation impersonating the rate-controlling, thus suppressing impairments in the process and the production efficiency.

A plurality of operations by the vacuumized transfer robot 142 impersonating the rate-controlling operations are not interrupted by insertion of operations associated with processes of other wafers, excluding arrangement of any waiting time for the plural operations. Accordingly, the high efficiency of the operation of vacuumized transfer robot 142 can be maintained and the processing efficiency and productivity can be improved throughout the vacuum processing apparatus.

By performing operation along the pre-scheduling, in operations of preparation for the next lot and cassettes, for example, transferring and delivering the next cassette in timed relation to the end time of operation of the cassette now in process, generation of wasteful time can be reduced to improve the productivity.

In the waiting time arranged before the rate-controlling operation, an unavoidably formed shift from the schedule can be corrected and adjusted and then the rate-controlling operation proceeds and as a result, a reduction in productivity can be suppressed.

Further, in the present embodiment, the schedule is so set in advance as to permit the operation of vacuumized transfer robot 142 impersonating the rate-controlling operation can continue. As shown in the figure, the operation of the vacuumized transfer robot 142 continues from, especially, the operations 712 and 713 associated with the process of the third wafer and the operation times 720 to 721 and ensuing of the vacuumized transfer robot 142 are linked sequentially.

In the present embodiment, the time 701 for processing one sheet of wafer is longer than the shortest one of times for processing one sheet of wafer in the example of FIG. 6 but the time 702 for processing the six wafers is shorter than 615 shown in FIG. 6. In this manner, according to the present embodiment, the time for processing six or more wafers can also be shortened.

In the present embodiment, the vent operation of lock chamber 131 for unloading associated with the process of the first wafer also plays the role of the vent operation for loading associated with the process of the seventh wafer. An embodiment is possible in which the latter is changed to associate with the process of the sixth wafer. An example to this effect will be described with reference to FIG. 8.

Referring to FIG. 8, there is illustrated a chart showing flow of operation in the vacuum processing apparatus according to a modified embodiment, depicting a pre-scheduling when a plurality of wafers are processed in the course of operating the lock chambers 131 in parallel. In the figure, the operation of each wafer is illustrated in the form of the square-pillar which is decomposed into upper and lower two lines. The upper line indicates operation for handling the wafer and the lower line indicates operation in any lock chamber 131, that is, evacuation or vent, resembling FIG. 5.

In the schedule set in advance, individual operations 805 to 819 for processes of the individual wafers correspond to 705 to 719 shown in FIGS. 7A and 7B. The interchange operation by means of the vacuumized transfer robot 142 or atmospheric transfer robot 122 is also equivalent to that in the embodiment of FIG. 7.

In the modified example, by sequentially performing operations of the vacuumized transfer robot 142 impersonating the rate-controlling operation, the efficiency of that operation, the efficiency of processing throughout the vacuum processing apparatus and the productivity can be improved. To this end, the operation of interchanging the unprocessed wafer with the processed wafer by means of the vacuumized transfer robot 142 is carried out between the operation 715 associated with the process of the first wafer (operation for taking out the processed wafer from the process unit by means of the vacuumized transfer robot 142) and the operation 713 associated with the fourth wafer (operation for transferring the unprocessed wafer to deliver it onto the sample stage in the process unit).

Also, the interchange operation is executed between the operation 716 associated with the process of the first wafer (operation for delivering the processed wafer to any lock chamber 131) and the operation 712 associated with the process of the fifth wafer (operation for causing the vacuumized transfer robot 142 to take out the unprocessed wafer from any lock chamber 131).

Further, the delivery of the fourth wafer directed to any of the process units 101a to 101c (loading) is carried out after take-out of the first wafer. Accordingly, the vent operation (operation 717) in the lock chamber 131 for performing unloading in association with processing the first processed wafer also plays the role of the vent operation 708 in the lock chamber 131 for performing loading the seventh unprocessed wafer to the vacuumized transfer unit 141. In addition, the interchange operation is executed between the operation 818 associated with processing the first processed wafer and the operation 810 associated with the sixth unprocessed wafer.

In the present embodiment, too, like the embodiment shown in FIGS. 7A and 7B, synchronization between operations associated with the precedently processed wafer and the successively processed wafer can be set up by arranging waiting time 803 or 804 before or after the operation impersonating the rate-controlling. Uncontrollable shifts from the pre-schedule can be absorbed by the blank time 803 or 804 to suppress the occurrence of a delay in the later operation impersonating the rate-controlling, thus suppressing impairments in the process and the production efficiency.

A plurality of operations by the vacuumized transfer robot 142 impersonating the rate-controlling are not interrupted by insertion of operations associated with processes of other wafers, excluding arrangement of any waiting time. Accordingly, the high efficiency of the operation of vacuumized transfer robot 142 can be maintained and the processing efficiency and productivity can be improved throughout the vacuum processing apparatus.

Meritorious operational effects similar to those in FIGS. 7A and 7B can be attained. In the present modified example, the time 801 required for processing one sheet of wafer is equivalent to the time 701 in the FIG. 7 example, but the time 802 required for processing six sheets of wafers increases, exceeding that in the related art shown in FIG. 6.

In the processes for wafers following the fourth wafer, take-out of the wafer for which the process has been started precedently is necessary and the interchange operation is impossible while the atmospheric transfer robot 122 or the vacuumized transfer robot 142 being conditioned for holding an unprocessed wafer. Accordingly, in order for the vacuumized transfer robot 142 to operate continuously, the vent operation in the lock chamber 131 for the fourth wafer, the interchange at the fourth wafer and the process for the sixth and ensuing wafers must be shared by the operation in the lock chamber 131 for unloading the processed wafer and for loading the unprocessed wafer.

In order to use in common the vent of the seventh or sixth wafer shown in FIGS. 7A and 7B and FIG. 8, the controller 144 may calculate times required for processing a given number of wafers and may select a shorter one when setting the pre-schedule.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A vacuum processing apparatus comprising:
   a plurality of vacuum containers, each having a processing chamber, each processing chamber being configured to generate a plasma to process a sample placed therein in a reduced pressure environment, wherein a plurality of said samples is processed using a same recipe among a plurality of said processing chambers in said plurality of vacuum containers;
   a vacuumized transfer unit, having a periphery connected with said plurality of vacuum containers, and having in an interior with a transfer chamber therein, the transfer chamber having a reduced pressure environment through which said sample is transferred;
   a plurality of lock chambers connected to said vacuumized transfer unit, each of said plurality of lock chambers having an interior configured to be adjustable in pressure to atmospheric pressure, and also adjustable in pressure to have a reduced pressure environment while said sample is placed therein;
   an atmospheric transfer container connected to an atmospheric side of a lock chamber, and including an interior space therein through which said sample is transferred at the atmospheric pressure, said sample being delivered or received through a lock chamber disposed between said vacuumized transfer unit and said atmospheric transfer container;
   a vacuumized transferring robot disposed in said transfer chamber of said vacuumized transfer unit, and configured to transfer said sample between any of said lock chambers and any of said processing chambers disposed inside said plurality of vacuum containers;
   an atmospheric transfer robot, disposed in the interior space of said atmospheric transfer container, and configured to transfer said sample from a cassette having a frontal side on which said sample is stored; and
   a controller, configured to perform a plurality of kinds of operations for each of said plurality of samples on a basis of schedule information of said plurality of kinds of operations, said plurality of kinds of operations covering take-out of said sample from said cassette, processing said sample in said processing chamber and thereafter returning said sample to said cassette, said plurality of kinds of operations including:

an operation to take-out and transfer said sample from said cassette to one of said lock chambers, an operation to reduce interior pressure to said reduced pressure environment while said sample is located inside thereof, an operation to transfer said sample from said lock chamber to said processing chamber via said vacuum transfer chamber, an operation to process the sample located inside said processing chamber, an operation to transfer said sample from said processing chamber to one of said lock chambers after said process of said sample, an operation to increase said interior pressure to said atmospheric pressure while said sample is located inside thereof, and an operation to return said sample from one of said lock chambers to said cassette; and wherein said schedule information of said plurality of kinds of operations which are sequentially performed for each of said plurality of samples includes data indicating allotted times for said plurality of kinds of operations for each of said plurality of samples, each of the allotted times including: a minimum actual operation time period from start to stop of the each operation, and at least one predetermined marginal short period designated before or after the minimum actual operation time period of the each operation, and wherein the allotted time of the each of said plurality of kinds of operations for each of said plurality of samples has a same length among corresponding ones of said plurality of kinds of operations for said plurality of samples stored in said cassette.

2. A vacuum processing apparatus according to claim 1, wherein said controller is configured to use previously stored information concerning times of individual operations and said actual operation times of each of said operations, so as to carry out an accumulation for a plurality of kinds of schedules in which said marginal short period and at least one of said waiting times are made to be different among said plurality of kinds of schedules, and is configured to select as schedule information an operation that minimizes the total process time for processing a given number of said samples.

3. A vacuum processing apparatus according to claim 1, wherein said controller has a function to control said operations on a basis of schedule information including at least one of waiting time of a predetermined length, before or after said allotted time for an operation of said plurality of operations that is detected as the longest amongst said plurality of operations, said waiting time disposed between said longest operation and another operation of said operations disposed immediately before or immediately after said longest operation.

4. A vacuum processing apparatus according to claim 1, wherein said controller has a function to control said operations on a basis of schedule information including at least one waiting time of a predetermined length, before or after said allotted time for an operation of said plurality of operations that is detected as the longest amongst said plurality of operations, said waiting time disposed between said longest operation and another operation of said operations disposed immediately before or immediately after said longest operation.

5. A vacuum processing apparatus according to claim 1, wherein one of said plurality of lock chambers is fixedly used for loading and the other is fixedly used for unloading.

6. A vacuum processing apparatus according to claim 5, wherein said controller has a function to control said operations on a basis of schedule information including at least one waiting time of a predetermined length, before or after said allotted time for an operation of said plurality of operations that is detected as the longest amongst said plurality of operations, said waiting time disposed between said longest operation and another operation of said operations disposed immediately before or immediately after said longest operation.

7. A vacuum processing apparatus according to claim 6, wherein said controller is configured to use previously stored information concerning times of individual operations and including said actual operation times of each of said operations so as to carry out an accumulation for a plurality of kinds of schedules in which said marginal short period and at least one of said waiting times are made to be different among said plurality of kinds of schedules, and is configured to select as operation the schedule information an operation that minimizes the total process time for processing a given number of said samples.

8. A vacuum processing apparatus according to claim 6, wherein pursuant to said schedule information, the waiting time is disposed immediately before the operation for taking in said sample to said lock chamber and immediately after completion of processing said sample in said processing chamber.

* * * * *